US007212079B2

(12) United States Patent
Blavette

(10) Patent No.: US 7,212,079 B2
(45) Date of Patent: May 1, 2007

(54) ATTENUATION OR TERMINATION ELEMENT HAVING A COAXIAL STRUCTURE FOR RADIO FREQUENCY ELECTROMAGNETIC WAVES

(75) Inventor: Yann Blavette, Saint Die (FR)

(73) Assignee: Huber+Suhner AG, Herisau (CH)

( * ) Notice: Subject to any disclaimer, the term of this patent is extended or adjusted under 35 U.S.C. 154(b) by 89 days.

(21) Appl. No.: 10/526,292

(22) PCT Filed: Aug. 29, 2003

(86) PCT No.: PCT/CH03/00590

§ 371 (c)(1), (2), (4) Date: Mar. 1, 2005

(87) PCT Pub. No.: WO2004/023596

PCT Pub. Date: Mar. 18, 2004

(65) Prior Publication Data

US 2006/0097817 A1 May 11, 2006

(30) Foreign Application Priority Data

Sep. 4, 2002 (CH) .................................... 1507/02

(51) Int. Cl.
*H03H 7/24* (2006.01)

(52) U.S. Cl. .................................. 333/81 A; 333/22 R

(58) Field of Classification Search ............. 333/81 A, 333/81 B, 22 R
See application file for complete search history.

(56) References Cited

U.S. PATENT DOCUMENTS

| | | | | |
|---|---|---|---|---|
| 2,689,294 A | | 9/1954 | Weber et al. | |
| 2,864,063 A | | 12/1958 | Felsen et al. | |
| 3,227,975 A | | 1/1966 | Hewlett et al. | |
| 3,260,971 A | | 7/1966 | Bacher et al. | |
| 4,272,739 A | * | 6/1981 | Nesses | 333/81 A |
| 5,047,737 A | | 9/1991 | Oldfield | |
| 5,194,834 A | | 3/1993 | Bacher et al. | |

FOREIGN PATENT DOCUMENTS

JP 61 264801 A 11/1986

* cited by examiner

*Primary Examiner*—Stephen E. Jones
(74) *Attorney, Agent, or Firm*—The Webb Law Firm

(57) ABSTRACT

The invention relates to an attenuation or termination element comprising at least one resistance part which is mounted in an outer conductor and has at least one connection to an inner conductor part. The resistance part is produced from at least two separately produced plate-shaped parts which are desirably provided with a central slit enabling them to be fitted together. The attenuation or termination element can be economically produced and has high heat dissipation.

16 Claims, 2 Drawing Sheets

ATTENUATION OR TERMINATION ELEMENT HAVING A COAXIAL STRUCTURE FOR RADIO FREQUENCY ELECTROMAGNETIC WAVES

BACKGROUND OF THE INVENTION

The invention relates to an attenuation or termination element having a coaxial structure for radiofrequency electromagnetic waves, having at least one resistive part, which is positioned in the outer conductor and has at least one connection to an inner conductor part. Such attenuation elements have long been known. For example, U.S. Pat. No. 3,227,975 shows an attenuation element for the non-adjustable attenuation of electromagnetic waves which has a dielectric, plate-like carrier which is arranged in a cylindrical outer conductor. This dielectric carrier is located between two inner conductor parts. A film of resistive material is applied to the carrier. One difficulty associated with such an attenuation element is the dissipation of the heat from the resistive part. In particular at high powers, high temperatures may in this case result which are undesirable. In addition, the production costs are relatively high, in particular if a high degree of precision is required.

U.S. Pat. No. 3,260,971 has disclosed an attenuation element in which a part is provided as the carrier for the resistor which has, in cross section, the form of a wheel and has a hub in the form of a roll which likewise forms a carrier for resistive areas. The production of such a carrier and, in particular, the application of the resistors is in this case relatively complex. In particular, it is barely possible in this case to apply the resistors by means of screen printing or photolithography, as is in many cases desirable and favorable in terms of costs.

SUMMARY OF THE INVENTION

The invention is based on the object of providing an attenuation or termination element of the type mentioned which can be produced more cost-effectively and yet with a high degree of precision.

The object is achieved in the case of a generic attenuation or termination element by the resistive part being produced from at least two separately produced, plate-like parts. With the attenuation or termination element according to the invention, the resistive part thus comprises at least two plate-like parts. Prior to assembly of the plate-like parts, circuits are applied to them in a cost-effective manner, for example by means of screen printing or photolithography.

In accordance with one development of the invention, at least two plate-like parts are arranged so as to form a cross in cross section. This makes possible an attenuation element or a termination with eight circuits. Since, as mentioned, the plate-like parts are preferably provided with the circuits prior to assembly, these eight circuits can be applied in a cost-effective manner, for example by means of screen printing or photolithography. Such a cross-shaped arrangement makes possible particularly favorable and precise positioning of the carrier in the interior of a cylindrical outer conductor. Since the heat can be emitted to all sides, a high level of heat dissipation from the resistive circuits is possible. Given the same power, lower surface temperatures are thus produced. The life of the attenuation element can thus be extended. It is also advantageous that the coaxial structure in the region of the attenuation element or termination element is essentially maintained and, as a result, fewer reflections are produced than in the case of a planar structure.

In accordance with one development of the invention, at least one inner conductor part is provided with slots at the front for the purpose of receiving the resistive part, the slotted region being formed in cross section so as to correspond to the cross section of the resistive part. The inner conductor part may then be pushed onto the carrier during production and is preferably connected to conductive layers which are applied to the carrier. If, for example, eight circuits are provided, in this manner the inner conductor can now be electrically connected directly to all of these eight circuits, for example by being plugged on or soldered.

In accordance with one development of the invention, the plate-like parts are inserted, in each case with an outer edge, in a respective groove in the inner side of the outer conductor. This makes it possible to center the resistive part in the inner conductor particularly accurately. In addition, the plate-like parts can be connected in these grooves to the outer conductor by means of soldering. However, this is not absolutely necessary since the plate-like parts can be fixed in the grooves in principle in an interlocking manner.

The attenuation element is suitable, in particular in measurement technology, for power protection for measuring heads or other measuring devices.

BRIEF DESCRIPTION OF THE DRAWINGS

Exemplary embodiments of the invention will be explained in more detail below with reference to the drawing, in which.

DETAILED DESCRIPTION OF THE INVENTION

Figure 1A:
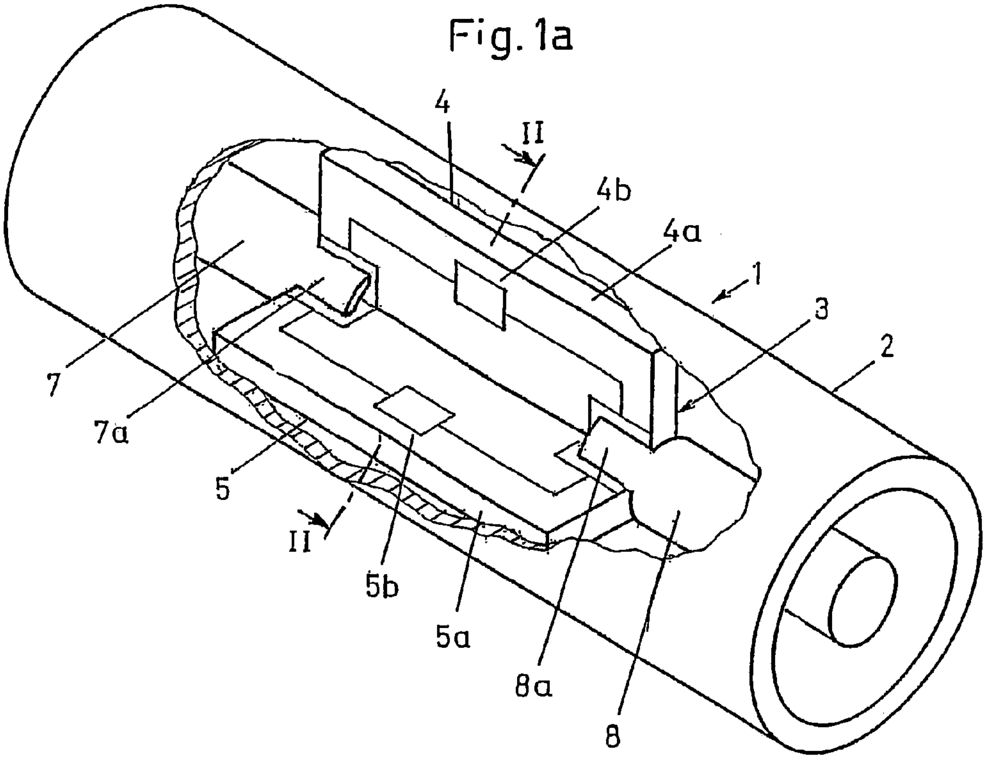
FIG. 1*a* shows a schematic of a view of a partially sectioned attenuation element.
Figure 1B:
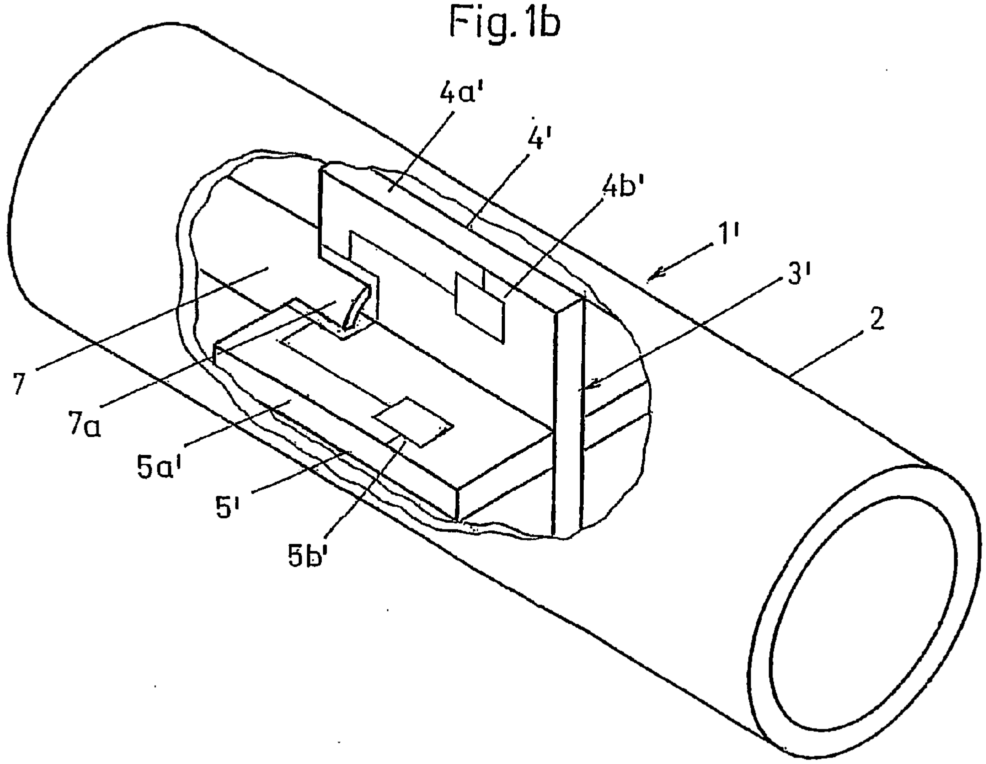
FIG. 1*b* shows a schematic of a view of a partially sectioned termination element.
Figure 2:
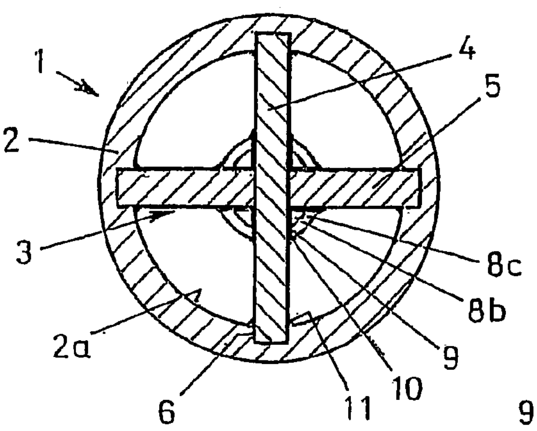
FIG. 2 shows a section through the attenuation element along the line II—II in FIG. 1*a*.

The attenuation element 1 shown in FIGS. 1 and 2 is provided for radiofrequency electromagnetic waves of, for example, 40 GHz and serves, for example in measurement technology, for protecting a measuring device. It is produced so as to have a coaxial structure and has a hollow-cylindrical outer conductor 2 which has four grooves 6 in one inner side 2*a* as shown in FIG. 2, a resistive part 3 being inserted in said grooves 6.

Figure 3:
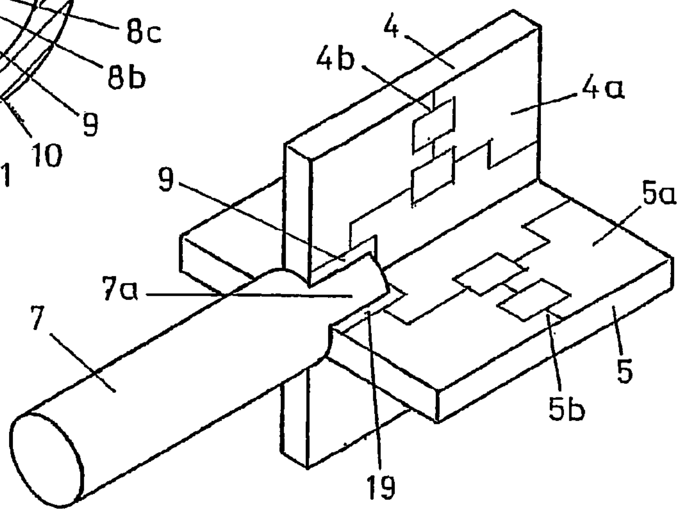
FIG. 3 shows a schematic of a three-dimensional view of a carrier having eight circuits and an inner conductor part.

The resistive part 3 comprises at least two plate-like parts 4 and 5 which each have a dielectric plate 4*a* and 5*a*, respectively, to both sides of which circuits 4*b* and 5*b*, respectively, are applied. The dielectric plates 4 and 5 are made of, for example, ceramic or another suitable dielectric. The circuits 4*b* and 5*b*, as well as the further six circuits which are hidden in FIG. 3, are applied to dielectric plates 4 and 5 in a manner known per se, for example by means of screen printing or photolithography. The plate-like parts 4 and 5 thus form so-called wafers, whose production is known per se.

The resistive part 3 is connected to two inner conductor parts 7 and 8 which are arranged opposite, are in the form of bolts or pins and are each provided at one end 7*a* and 8*a*, respectively, with cross-shaped slots 8*b*. As shown in FIG. 2, these slots 8*b* form four symmetrically arranged fingers 8*c* which engage in the resistive part 3. These fingers 8*c* are each connected to two conductor layers 9, in particular by means of soldered joints 10. The connection of the inner conductor parts 7 and 8 to the resistive part 3 may also be a mechanical one, for example by means of clamping. As can be seen, each inner conductor part 7 and 8, respectively, is connected, in particular soldered, to each of the eight circuits. Each of the eight circuits thus has a dedicated electrical contact.

Figure 4:
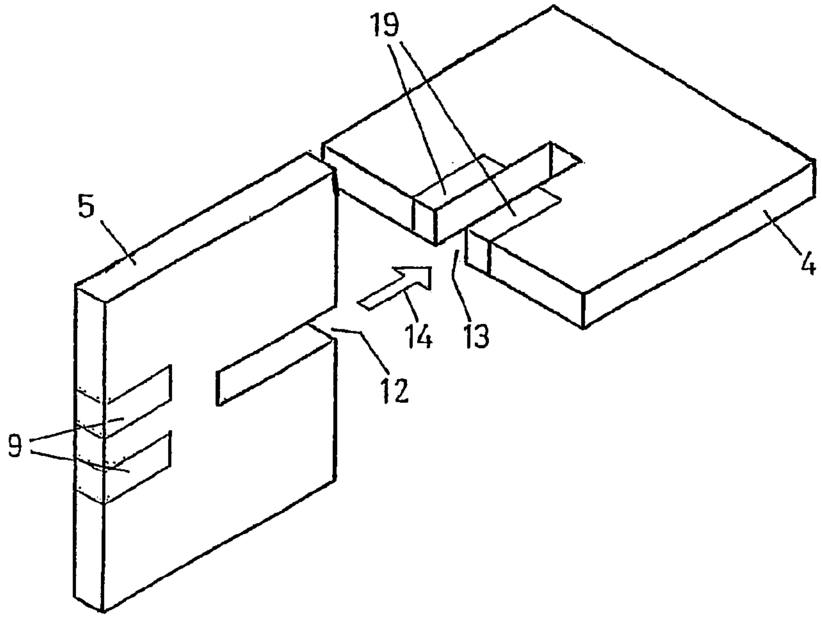
FIG. 4 shows a schematic illustrating the joining of two plate-like parts.

As shown in FIGS. 3 and 4, the resistive part 3 comprises two separately produced, plate-like parts 4 and 5. The plate-like parts 4 and 5 comprise, as explained above, the dielectric plates 4*a* and 5*a*, respectively, the eight circuits applied (which are not shown in FIG. 4), as well as the conductor layers 9 and 19, respectively. Each plate-like part 4 and 5 is also provided with a central slot 12 and 13, respectively, the width of these slots 12 and 13 corresponding to the thickness of the plate-like parts 4 and 5, respectively. For assembly purposes, the plate-like parts 4 and 5 are plugged together in the direction of the arrow 14, as shown in FIG. 4. The slots 12 and 13 in the process thus each receive the other part 4 and 5, respectively. If the plate-like parts 4 and 5 are plugged together, they form the arrangement shown in FIG. 3 in which the plate-like parts 4 and 5 are perpendicular to one another, as is illustrated. In principle, the plate-like parts 4 and 5 can be slightly offset in the axial direction. In addition, a design is conceivable in which more than two plate-like parts 4 and 5 are assembled.

The conductor layers 9 and 19 serve to connect the inner conductor part 7. As already explained, the connection can be made using soldered joints 10 or by means of mechanical clamping. With the arrangement shown in FIG. 3, only one inner conductor part 7 is provided. If a second inner conductor part 8 is provided, as shown in FIG. 1, the plate-like parts 4 and 5 are correspondingly provided with further conductor layers 9 and 19.

The resistive part 3 is inserted in the inner conductor 2, this inner conductor 2 being centered and aligned precisely in the grooves 6. The resistive part 3 is preferably connected in the grooves 6 to the outer conductor 2 by means of soldered joints 11. The inner conductor 3 is thus connected to the outer conductor 2 at four points, which makes possible the effective heat dissipation mentioned. The heat produced in the resistive part 3 can thus be dissipated in a plurality of directions into the outer conductor 2. The centering of the resistive part 3 in the four grooves 6 permits a relatively high tolerance in the width of the electric plates 4*a* and 5*a*. Since the plate-like parts 4 and 5 can be produced prior to assembly, the application of the circuits 4*b* and 5*b* is possible in a manner known per se and in a cost-effective manner by means of screen printing or photolithography. The production of the electric plates 4*a* and 5*a* is likewise possible in a cost-effective manner by means of cutting using a laser beam or by means of stamping, for example.

The termination element 1' shown in FIG. 1*b* has essentially the same design as the attenuation element 1, but has only one inner conductor part, and, on the resistive part 3', the circuits 4*a*' and 5*b*' and the circuits which cannot be seen here are correspondingly routed to the outside. The termination element 1' serves the purpose, for example, of preventing radiated emissions or of eliminating irregularities.

Attenuation elements 1 may also be arranged one after the other in series, and a termination element 1' may be connected after one or more attenuation elements 1. The heat emission can thus be distributed over a plurality of elements.

The invention claimed is:

1. An attenuation or termination element having a coaxial structure for radiofrequency electromagnetic waves, having at least one resistive part, which is positioned in an outer conductor and has at least one connection to an inner conductor part, wherein the resistive part is produced from at least two separately produced plates, wherein the plates are each provided with a central slot and are plugged together using these slots.

2. The element of claim 1, wherein the resistive part engages grooves in an inner side of the outer conductor and is centered in these grooves.

3. The element of claim 1, wherein the resistive part is soldered to the outer conductor on the inner side of said outer conductor.

4. The element of claim 1, wherein the two plates are joined together to form a cross.

5. The element of claim 1, wherein the two plates each have circuits on both sides which are applied to dielectric plates.

6. The element of claim 5, wherein the resistive part has at least eight circuits.

7. The element of claim 5, wherein the circuits are applied by means of screen printing or photolithography.

8. The element of claim 1, wherein the two plates are plugged together to form a cross.

9. The element of claim 8, wherein the inner conductor part is provided with slots at one end, said slots being formed in cross section so as to correspond to the cross section of the plates.

10. The element of claim 8, wherein the plates each have circuits on both sides which are applied to dielectric plates.

11. The element of claim 10, wherein the inner conductor part is provided with slots at one end, said slots being formed in cross section so as to correspond to the cross section of the plates.

12. The element of claim 1, wherein the inner conductor part fixes the two plates.

13. The element of claim 12, wherein the two plates are joined together to form a cross.

14. The element of claim 12, wherein the resistive part engages grooves in an inner side of the outer conductor and is centered in these grooves.

15. The element of claim 12, wherein the resistive part is soldered to the outer conductor on the inner side of said outer conductor.

16. The element of claim 12, wherein the plates each have circuits on both sides which are applied to dielectric plates.

* * * * *